(12) United States Patent     (10) Patent No.:   US 12,657,948 B2

Chen et al.     (45) Date of Patent:   *Jun. 16, 2026

(54) ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/931,196

(22) Filed: Oct. 30, 2024

(65) Prior Publication Data

US 2025/0054332 A1    Feb. 13, 2025

Related U.S. Application Data

(63) Continuation of application No. 18/489,061, filed on Oct. 18, 2023, now Pat. No. 12,159,479.

(30) Foreign Application Priority Data

Nov. 22, 2022    (CN) .......................... 202211464798.6

(51) Int. Cl.
| | |
|---|---|
| *G06V 40/10* | (2022.01) |
| *G06V 40/13* | (2022.01) |
| *H10K 39/34* | (2023.01) |
| *G06F 3/041* | (2006.01) |

(52) U.S. Cl.
CPC ......... *G06V 40/1318* (2022.01); *H10K 39/34* (2023.02); *G06F 3/0412* (2013.01)

(58) Field of Classification Search
None
See application file for complete search history.

(56) References Cited

U.S. PATENT DOCUMENTS

| | | | |
|---|---|---|---|
| 2004/0252867 A1 | 12/2004 | Lan | |
| 2022/0057664 A1* | 2/2022 | Higano | ............... G02F 1/13338 |
| 2023/0329050 A1* | 10/2023 | Choi | ...................... H10K 39/34 |

OTHER PUBLICATIONS

Chinese language office action dated Jul. 10, 2025, issued in application No. TW 112109310.

* cited by examiner

*Primary Examiner* — Joseph R Haley

(74) *Attorney, Agent, or Firm* — McClure, Qualey & Rodack, LLP

(57)        ABSTRACT

An electronic device includes a light source and an optical sensor. The light source emits a light having a maximum light intensity at a first wavelength A. The optical sensor has a maximum response value at a second wavelength B, and receives a reflected portion of the light that is reflected by an object. The integral value of the light intensity of the light from the wavelength 380 nm to the first wavelength A is $I_1$. The integral value of the light intensity of the light from the first wavelength A to the wavelength 780 nm is $I_2$. The first wavelength A, the second wavelength B, the integral value $I_1$, and the integral value $I_2$ satisfy the following equation: $(B-A)*(I_2-I_1)>0$.

17 Claims, 10 Drawing Sheets

ELECTRONIC DEVICE

CROSS REFERENCE TO RELATED APPLICATIONS

This application is a Continuation of U.S. application Ser. No. 18/489,061, filed Oct. 18, 2023, now U.S. Pat. No. 12,159,479, which claims the benefit of China Application No. 202211464798.6, filed on Nov. 22, 2022, the entirety of which is incorporated by reference herein.

BACKGROUND OF THE DISCLOSURE

Field of the Invention

The present invention relates to an electronic device, and, in particular, to an electronic device for improving the response of a light sensor.

Description of the Related Art

In products that integrate displays and optical sensors, the industry wants to reduce manufacturing costs by using the display light source as a reactive light source for an optical sensor. However, the process still encounters the problem of showing that the light source is reflected in the lower band of the response of the optical sensor. In existing technology, the response band of the optical sensor does not overlap the display light source, so the light response of the optical sensor is not good. In addition, the display light source still needs to meet the color gamut requirements.

BRIEF SUMMARY OF THE DISCLOSURE

An embodiment of the present disclosure provides an electronic device. The electronic device includes a light source and an optical sensor. The light source emits a light having a maximum light intensity at a first wavelength A. The optical sensor has a maximum response value at a second wavelength B, and receives the reflected portion of the light that is reflected by an object. The integral value of the light intensity of the light from the wavelength 380 nm to the first wavelength A is $I_1$. The integral value of the light intensity of the light from the first wavelength A to the wavelength 780 nm is $I_2$. The first wavelength A, the second wavelength B, the integral value $I_1$, and the integral value $I_2$ satisfy the following equation: $(B-A)*(I_2-I_1)>0$.

BRIEF DESCRIPTION OF THE DRAWINGS

The disclosure can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration. This means that many special details, relationships and methods are disclosed to provide a complete understanding of the disclosure.

DETAILED DESCRIPTION OF THE DISCLOSURE

Figure 1:
FIG. 1 is a spectral response diagram of a light source and an optical sensor included in an electronic device in accordance with some embodiments of the present disclosure.

In order to make the above purposes, features, and advantages of some embodiments of the present disclosure more comprehensible, the following is a detailed description in conjunction with the accompanying drawing.

Certain terms are used throughout the description and following claims to refer to particular components. As one skilled in the art will understand, electronic equipment manufacturers may refer to a component by different names. This document does not intend to distinguish between components that differ in name but not function. It is understood that the words "comprise", "have" and "include" are used in an open-ended fashion, and thus should be interpreted to mean "include, but not limited to . . . ". Thus, when the terms "comprise", "have" and/or "include" used in the present disclosure are used to indicate the existence of specific technical features, values, method steps, operations, units and/or components. However, it does not exclude the possibility that more technical features, numerical values, method steps, work processes, units, components, or any combination of the above can be added.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to as being "on another component", it may be directly on this other component, or other components may exist between them. On the other hand, when the component is referred to as being "directly on another component (or the variant thereof)", there is no component between them. Furthermore, when the corresponding component is referred to as being "on another component", the corresponding component and the other component have a disposition relationship along a top-view/vertical direction, the corresponding component may be below or above the other component, and the disposition relationship along the top-view/vertical direction is determined by the orientation of the device.

It should be understood that when a component or layer is referred to as being "connected to" another component or layer, it can be directly connected to this other component or layer, or intervening components or layers may be present. In contrast, when a component is referred to as being "directly connected to" another component or layer, there are no intervening components or layers present.

The electrical connection or coupling described in this disclosure may refer to direct connection or indirect connection. In the case of direct connection, the endpoints of the components on the two circuits are directly connected or connected to each other by a conductor line segment, while in the case of indirect connection, there are switches, diodes, capacitors, inductors, resistors, other suitable components, or a combination of the above components between the endpoints of the components on the two circuits, but the intermediate component is not limited thereto.

The words "first", "second", "third", "fourth", "fifth", and "sixth" are used to describe components. They are not used to indicate the priority order of or advance relationship, but only to distinguish components with the same name.

It should be noted that the technical features in different embodiments described in the following can be replaced, recombined, or mixed with one another to constitute another embodiment without departing from the spirit of the present disclosure.

In the present disclosure, the electronic device may include a display device, a backlight device, an antenna device, a sensing device, or a splicing device, etc., but is not limited thereto. The electronic device may be a bendable or flexible electronic device. The display device may be a non-self-luminous display device or a self-luminous display device. The antenna device may be a liquid-crystal antenna device or a non-liquid-crystal antenna device, and the sensing device may be a sensing device for sensing capacitance, light, heat, or ultrasonic waves, but is not limited thereto. The electronic components may include passive and active components, such as capacitors, resistors, inductors, diodes, transistors, and the like. The diodes may include light-emitting diodes or photodiodes. The light-emitting diode may include organic light-emitting diode (OLED), inorganic light-emitting diode, micro-LED, mini-LED, quantum dot light-emitting diode (QLED, QDLED), other suitable materials or a combination of the above materials, but is not limited thereto. The splicing device may be, for example, a splicing display device or a splicing antenna device, but is not limited thereto. In addition, the display device in the electronic device may be a color display device or a monochrome display device, and the shape of the electronic device may be rectangular, circular, polygonal, a shape with curved edges, or other suitable shapes. In addition, the electronic device described below uses, as an example, the sensing of a touch through an embedded touch device, but the touch-sensing method is not limited thereto, and another suitable touch-sensing method can be used provided that it meets all requirements.

FIG. 1 is a spectral response diagram of a light source and an optical sensor included in an electronic device in accordance with some embodiments of the present disclosure. In some embodiments, the electronic device of the present disclosure includes a light source and an optical sensor. As shown in FIG. 1, the light source emits a light having a maximum light intensity at a first wavelength A, so that a spectral response curve 100 is generated. The optical sensor has a maximum response value at a second wavelength B, so that a spectral response curve 102 is generated. The optical sensor receives the reflected portion of the light that is reflected by the object. In some embodiments, the light emitted by the light source is the light measured from the light-emitting side of the electronic device. The first wavelength A and the spectral response curve 100 may be measured through a spectral response device. In some embodiments, the first wavelength A ranges from 500 nm to 540 nm (500 nm<=first wavelength A<=540 nm), but the present disclosure is not limited thereto. In some embodiments of FIG. 1, the first wavelength A may be, for example, 520 nm, but the present disclosure is not limited thereto. In some embodiments, the second wavelength B ranges from 750 nm to 1050 nm (750 nm<=second wavelength B<=1050 nm), but the present disclosure is not limited thereto. In some embodiments of FIG. 1, the second wavelength B may be, for example, 852 nm, but the present disclosure is not limited thereto.

Figure 2:
FIG. 2 is a partial detailed schematic diagram of the spectral response diagram in FIG. 1 in accordance with some embodiments of the present disclosure.

In some embodiments, the second wavelength B and the spectral response curve 102 may be measured through a look-up table or through a spectral response device. In some embodiments, the optical sensor includes an organic photodiode, but the present disclosure is not limited thereto. In order to obtain the spectral response curve 102 of the optical sensor in FIG. 1, the present disclosure uses probes to touch both ends of the optical sensor (such as an organic photodiode), and then gives the optical sensor full-band radiant light, therefore, the spectral response curve 102 of the optical sensor shown in FIG. 1 may be detected. FIG. 2 is a partial detailed schematic diagram of the spectral response diagram in FIG. 1 in accordance with some embodiments of the present disclosure. In other words, FIG. 2 is an enlargement of the portion of the spectral response curve 100 of the light source in FIG. 1. In some embodiments of FIG. 2, the present disclosure calculates the integral value of the light intensity from the wavelength 380 nm to the first wavelength A to be $I_1$. The present disclosure further calculates the integral value of the light intensity from the first wavelength A to the wavelength 780 nm to be $I_2$.

In some embodiments of FIG. 1 and FIG. 2, the second wavelength B is longer than the first wavelength A, but the present disclosure is not limited thereto. In some embodiments, the second wavelength B is longer than the first wavelength A, then at the intersection of the spectral response curve 100 of the light source and the spectral response curve 102 of the optical sensor, the response value of the optical sensor increase when the wavelength increases. Therefore, the integral value $I_1$ of the light intensity from the wavelength 380 nm to the first wavelength A may be smaller than the integral value $I_2$ of the light intensity from the first wavelength A to the wavelength 780 nm. That is, the left half integral value of the spectral response curve 100 of the light source may be smaller than the right half integral value of the spectral response curve 100 of the light source. In contrast, in some embodiments, the first wavelength A is longer than the second wavelength B (not shown), the response value of the optical sensor decreases when the wavelength increases. Therefore, the integral value $I_1$ of the light intensity from the wavelength 380 nm to the first wavelength A may be higher than the integral value $I_2$ of the light intensity from the first wavelength A to the wavelength 780 nm. That is, the left half integral value of the spectral response curve 100 of the light source may be greater than the right half integral value of the spectral response curve 100 of the light source.

Therefore, regardless of whether the second wavelength B is longer than the first wavelength A, or the first wavelength A is longer than the second wavelength B, the first wavelength A, the second wavelength B, the integral value $I_1$, and the integral value $I_2$ all satisfy the following equation 1.

$$(B - A) * (I_2 - I_1) > 0 \qquad \text{equation 1}$$

For example, in the case where the second wavelength B is longer than the first wavelength A, (B−A) is a positive value, and $(I_2 - I_1)$ is also a positive value, so equation 1 can be satisfied. In the case where the first wavelength A is longer than the second wavelength B, (B−A) is a negative value, and $(I_2 - I_1)$ is also a negative value, so equation 1 can also be satisfied.

In some embodiments of FIG. 2, the total integral of the spectral response curve 100 of the light source represents the total energy of the light source. The integral value $I_1$ of the light intensity from the wavelength 380 nm to the first wavelength A is the energy in the left half of the spectral response curve 100 of the light source. The integral value $I_2$ of the light intensity from the first wavelength A to the wavelength 780 nm is the energy of the right half of the spectral response curve 100 of the light source. In some embodiments, the energy in the left half of the spectral response curve 100 of the light source accounts for about 43% of the total energy of the light source. The energy in the right half of the spectral response curve 100 of the light source accounts for about 57% of the total energy of the light source.

In the prior art, the energy in the left half of the spectral response curve of the light source accounts for about 50% of the total energy of the light source. The energy in the right half of the spectral response curve of the light source also accounts for about 50% of the total energy of the light source. That is, the optical sensor may receive 50% of the total energy of the light source. In some embodiments of FIG. 2, the energy in the left half of the spectral response curve 100 of the light source accounts for about 43% of the total energy of the light source. The energy in the right half of the spectral response curve 100 of the light source accounts for about 57% of the total energy of the light source. That is, the optical sensor may receive 53.92% of the total energy of the light source. The embodiments in FIG. 2 of the present disclosure effectively increase the response value of the optical sensor. In some embodiments, in order to improve the response value of the optical sensor while taking into account the color gamut requirements of the light source, in some embodiments of FIG. 2, the integral value $I_1$ and the integral value $I_2$ satisfy the following equation 2.

$$1 < I_2/I_1 = 3.5 \qquad \text{equation 2}$$

In some embodiments, equation 2 is an example where the light source is a green light, but the present disclosure is not limited thereto.

Figure 3:
FIG. 3 is a schematic diagram of wavelength points of 50% of the maximum light intensity on both sides of a spectral response curve 100 of the light source in FIG. 1 in accordance with some embodiments of the present disclosure.

FIG. 3 is a schematic diagram of wavelength points of 50% of the maximum light intensity on both sides of a spectral response curve 100 of the light source in FIG. 1 in accordance with some embodiments of the present disclosure. As shown in FIG. 3, in the spectral response curve 100 of the light source, the present disclosure obtains a third wavelength C and a fourth wavelength D according to the light intensity. In some embodiments of FIG. 3, the second wavelength B (shown in FIG. 1) is longer than the first wavelength A. In some embodiments, the light has a light intensity of 50% of the maximum light intensity (i.e., the first wavelength A) at the third wavelength C and the fourth wavelength D. In some embodiments of FIG. 3, the third wavelength C is longer than the fourth wavelength D, and the first wavelength A, the third wavelength C, and the fourth wavelength D satisfy the following equation 3.

$$C - A > A - D \qquad \text{equation 3}$$

For example, in some embodiments, the third wavelength C is 536 nm, the fourth wavelength D is 507 nm, and the first wavelength A is 520 nm. The difference between the third wavelength C and the first wavelength A is 16 nm, and the difference between the first wavelength A and the fourth wavelength D is 13 nm, which satisfy equation 3. In some embodiments, the advantage of equation 3 is that there is no need to calculate the integral value of the spectral response curve 100 of the light source. The present disclosure directly compares the difference between the third wavelength C and the first wavelength A and the difference between the first wavelength A and the fourth wavelength D, so that the present disclosure can determine whether the energy of the right half of the spectral response curve 100 of the light source is higher than the energy of the left half of the spectral response curve 100 of the light source. For example, since the difference between the third wavelength C and the first wavelength A is greater than the difference between the first wavelength A and the fourth wavelength D, the present disclosure can directly infer that the area (i.e., energy) of the right half of the spectral response curve 100 of the light source may be larger than the area of the left half of the spectral response curve 100 of the light source. For example, in some embodiments of FIG. 3, the difference between the third wavelength C and the first wavelength A is 16 nm, and the difference between the first wavelength A and the fourth wavelength D is 13 nm. Therefore, the area (i.e., energy) of the right half of the spectral response curve 100 of the light source is larger than the area of the left half of the spectral response curve 100 of the light source. In some embodiments of FIG. 3, the energy between the first wavelength A and the fourth wavelength D in the left half of the spectral response curve 100 of the light source accounts for about 46% of the total energy of the light source. The energy between the first wavelength A and the third wavelength C in the right half of the spectral response curve 100 of the light source accounts for about 54% of the total energy of the light source. That is, the optical sensor may receive 54% of the total energy of the light source.

Figure 4:
FIG. 4 is a schematic diagram of calculating the light intensity integral of 25% of the maximum light intensity at the tail of the spectral response curve 100 of the light source in FIG. 1 in accordance with some embodiments of the present disclosure.

FIG. 4 is a schematic diagram of calculating the light intensity integral of 25% of the maximum light intensity at the tail of the spectral response curve 100 of the light source in FIG. 1 in accordance with some embodiments of the present disclosure. In some embodiments, the tail is the region where the light intensity in the spectral response curve 100 is less than or equal to 25% of the maximum light intensity. In some embodiments of FIG. 4, in the spectral response curve 100 of the light source, the present disclosure obtains a fifth wavelength E and a sixth wavelength F according to the light intensity. In some embodiments of FIG. 4, the second wavelength B (shown in FIG. 1) is longer than the first wavelength A. In some embodiments, the light has a light intensity of 25% of the maximum light intensity (i.e., the first wavelength A) at the fifth wavelength E and the sixth wavelength F. In some embodiments of FIG. 4, the fifth wavelength E is longer than the sixth wavelength F. In some embodiments of FIG. 4, the present disclosure calculates the integral value of the light intensity from the fifth wavelength E to the wavelength 780 nm to be $I_3$. The present disclosure further calculates the integral value of the light intensity from the wavelength 380 nm to the sixth wavelength F to be $I_4$. The integral value $I_3$ and the integral value $I_4$ satisfy the following equation 4.

$$I_3 > I_4 \qquad \text{equation 4}$$

That is, in some embodiments of FIG. 4, the integral value at the tail of the right half of the spectral response curve 100 of the light source may be higher than the integral value at the tail of the left half of the spectral response curve 100 of the light source. In some embodiments, the ratio of the integral value $I_3$ to the integral value $I_4$, that is, $I_{3/I4}$ may be between 1.5 and 4.1, but the present disclosure is not limited thereto. For example, in some embodiments of FIG. 4, the ratio of the integral value $I_3$ and the integral value $I_4$ is 1.61. In some embodiments of FIG. 4, the energy at the tail of the left half of the spectral response curve 100 of the light source accounts for about 38% of the energy at the total tail of the light source. The energy at the tail of the right half of the spectral response curve 100 of the light source accounts for about 62% of the energy at the total tail of the light source. However, the present disclosure is not limited thereto. The energy at the total tail of the light source is the light intensity integral at the tail in the spectral response curve 100 of the light source.

In some embodiments, the present disclosure obtains a seventh wavelength G (not shown) and an eighth wavelength H (not shown) according to the light intensity. The light has a light intensity of 12.5% of the maximum light intensity (i.e., the first wavelength A) at the seventh wavelength G and the sixth wavelength H. The seventh wavelength is longer than the eighth wavelength G. The present disclosure calculates the integral value of the light intensity from the seventh wavelength G to the wavelength 780 nm to be Is (not shown). The present disclosure calculates the integral value of the light intensity from the wavelength 380 nm to the eighth wavelength H to be $I_6$ (not shown). Similarly, in the case where the second wavelength B (shown in FIG. 1) is longer than the first wavelength A, the integral value at the tail of the right half of the spectral response curve 100 of the light source may be higher than the integral value at the tail of the left half of the spectral response curve 100 of the light source. That is, the integral value $I_5$ is higher than the integral value $I_6$. In some embodiments, the ratio of the integral value $I_5$ to the integral value $I_6$, that is, $I_5/I_6$ may be between 1.5 and 4.5, but the present disclosure is not limited thereto. For example, the ration of the integral value Is to the integral value $I_6$ is 1.65.

Similarly, in some embodiments, the present disclosure obtains the third wavelength C and the fourth wavelength D according to the light intensity. The second wavelength B (shown in FIG. 1) is longer than the first wavelength A. In some embodiments, the light has a light intensity of 50% of the maximum light intensity (i.e., the first wavelength A) at the third wavelength C and the fourth wavelength D. The third wavelength C is longer than the fourth wavelength D (as shown in FIG. 3). The present disclosure calculates the integral value of the light intensity from the third wavelength C to the wavelength 780 nm to be $I_7$ (not shown). The present disclosure further calculates the integral value of the light intensity from the wavelength 380 nm to the fourth wavelength D to be Is (not shown). Similarly, in the case where the second wavelength B (shown in FIG. 1) is longer than the first wavelength A, the integral value at the tail of the right half of the spectral response curve 100 of the light source may be higher than the integral value at the tail of the left half of the spectral response curve 100 of the light source. That is, the integral value $I_7$ is higher than the integral value $I_8$. In some embodiments, the ratio of the integral value $I_7$ to the integral value $I_8$, that is, $I_7/I_8$ may be between 1.5 and 3.5, but the present disclosure is not limited thereto. For example, the ration of the integral value $I_7$ to the integral value $I_5$ is 1.69.

In other words, this present disclosure may improve the response value of the optical sensor and reduce the impact on the color gamut of the light source by adjusting the difference in integral values between the points at 50%, 25%, and 12.5% of the maximum light intensity on the both sides of the light source to the tail end point.

Figure 5:
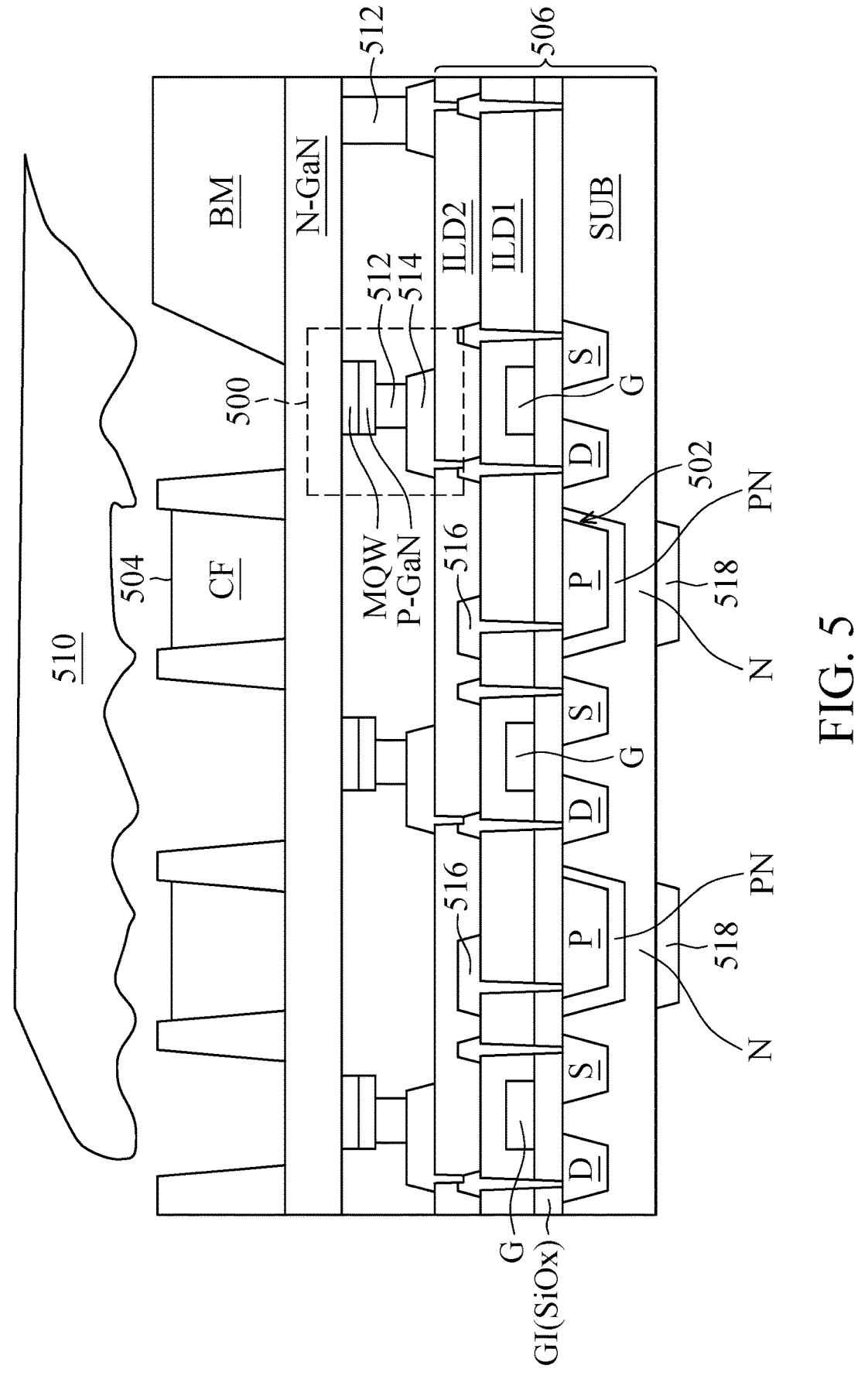
FIG. 5 is a cross-sectional structure schematic diagram of an electronic device based on a complementary metal-oxide semiconductor (CMOS) backplane in accordance with some embodiments of the present disclosure.

FIG. 5 is a cross-sectional structure schematic diagram of an electronic device based on a complementary metal-oxide semiconductor (CMOS) backplane in accordance with some embodiments of the present disclosure. As shown in FIG. 5, the electronic device includes a light source 500, an optical sensor 502, and a color filter layer (CF) 504. In some embodiments of FIG. 5, a finger 510 is close to the top of the electronic device, so that the light emitted by the light source 500 can be reflected through the finger 510. The reflected portion of the light is filtered by the color filter layer 504, and is finally received by the optical sensor 502. The light intensity of the reflected portion of the light is detected by the optical sensor 502. In some embodiments, the light source 500 is disposed between the optical sensor 502 and the color filter layer 504, but the present disclosure is not limited thereto.

In some embodiments, the light source 500 includes a multiple-quantum well (MQW) structure, a P-type GaN layer (P-GaN), and an N-type GaN layer (N-GaN). The light source 500 is electrically connected to the drain (D) of a transistor in a CMOS backplane 506 through a solder 512 and pad 514. In some embodiments, the multiple-quantum well MQW of the light source 500 emits light. In some embodiments, the CMOS backplane 506 includes a substrate SUB, an insulating layer GI, an interlayer dielectric layer ILD1, and an interlayer dielectric layer ILD2. In some embodiments, the material of the substrate SUB may include silicon (Si), germanium (Ge), silicon carbide (SiC), and silicon germanium (SiGe). In some embodiments, the optical sensor 502 is the substrate SUB disposed in the CMOS backplane 506. In detail, the P pole (P), N pole (N) and PN junction (PN) of the optical sensor 502 are disposed on the substrate SUB in the CMOS backplane 506. The P pole (P) of the optical sensor 502 is electrically connected to an anode 516, and the N pole (N) of the optical sensor 502 is electrically connected to a cathode 518.

In some embodiments, the optical sensor 502 is fabricated through a doping process, but the present disclosure is not limited thereto. The doping material used in the doping process may be, for example, boron (B), arsenic (As), etc., but the present disclosure is not limited thereto. In some embodiments, the drain (D) and source(S) of the transistor are formed in the substrate SUB, and the gate (G) of the transistor is formed in the interlayer dielectric layer ILD1. In some embodiments, the insulating layer GI may include, for example, silicon oxide (SiOx), but the present disclosure is not limited thereto. The interlayer dielectric layer ILD1 and the interlayer dielectric layer ILD2 may include, for example, silicon oxide (SiOx), silicon nitride (SiNx) or silicon oxynitride (SiOxNx), but the present disclosure is not limited thereto.

In some embodiments, the color filter layer 504 is disposed on the N-type gallium nitride layer (N-GaN) of the light source 500. In some embodiments, the color filter layer 504 is surrounded by a light-shielding layer (BM) for shielding light scattered from the finger 510. The reflected portion of the light reflected from the finger 510 passes through the color filter layer 504 and is finally received by the optical sensor 502. In some embodiments, there is no light-shielding layer (BM) above the N-type GaN layer (N-GaN) of the light source 500, so that the light emitted by the light source 500 can be transmitted to the finger 510.

Figure 6:
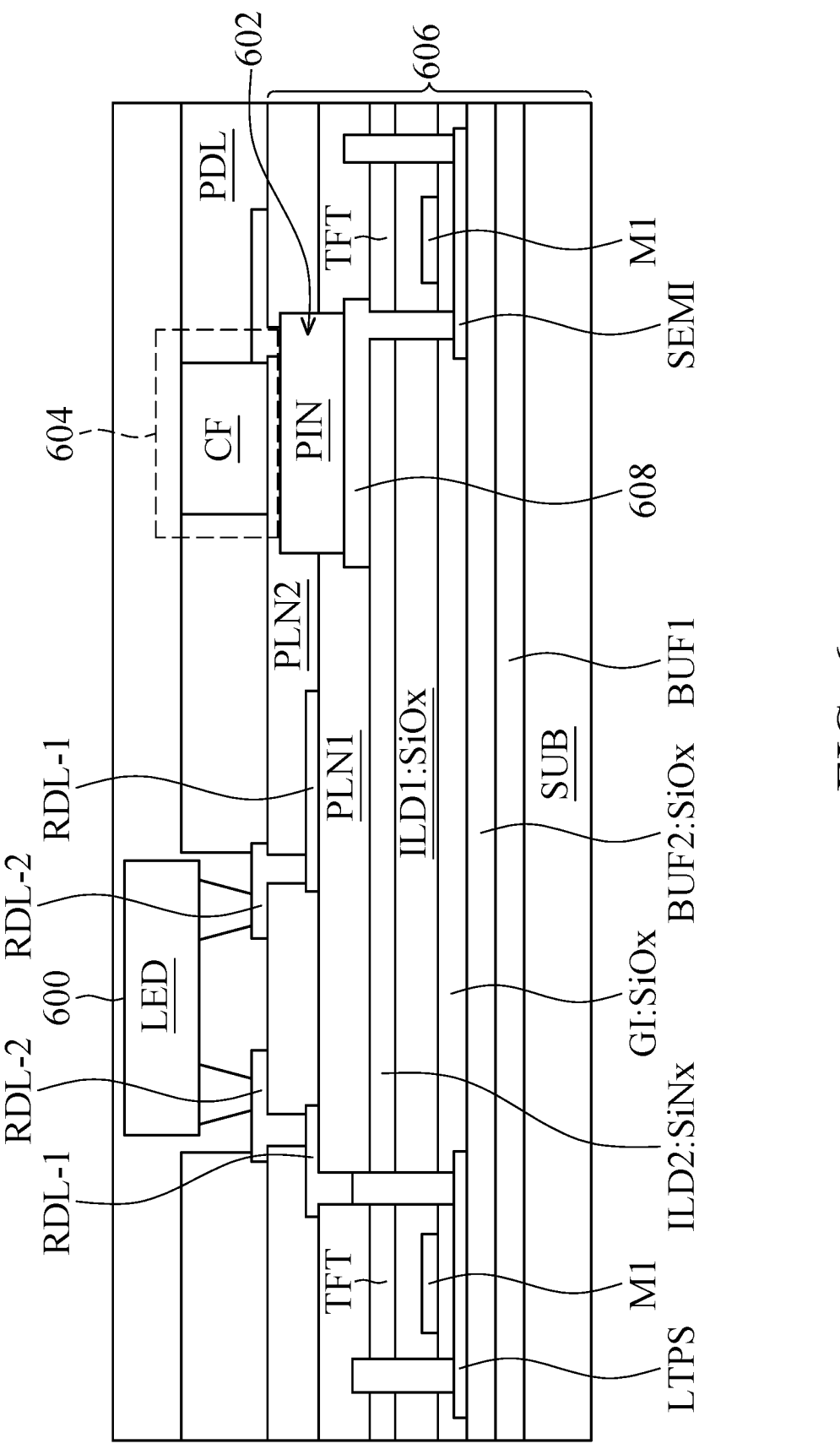
FIG. 6 is a cross-sectional structure schematic diagram of an electronic device based on a thin-film transistor (TFT) backplane in accordance with some embodiments of the present disclosure.

FIG. 6 is a cross-sectional structure schematic diagram of an electronic device based on a thin-film transistor (TFT) backplane in accordance with some embodiments of the present disclosure. As shown in FIG. 6, the electronic device includes a light source (LED) 600, an optical sensor 602, and a color filter layer (CF) 604. The optical sensor 602 includes a PIN-type junction (PIN). In some embodiments of FIG. 6, the light source 600 emits light, and the light is reflected by a finger (such as the finger 510 in FIG. 5). The reflected portion of the light passes through the color filter layer 604 and is received by the optical sensor 602. In some embodiments of FIG. 6, the light source 600 and the color filter layer 604 are disposed on a TFT backplane 606. In some embodiments, the optical sensor 602 is disposed in the TFT backplane 606. In some embodiments, the TFT backplane 606 includes a substrate (SUB), a buffer layer (BUF1), a buffer layer (BUF2:SiOx), an insulating layer (GI(SiOx)), an interlayer dielectric layer (ILD1:SiOx), an interlayer dielectric layer (ILD2:SiNx), a planarization layer (PLN1), and a planarization layer (PLN2).

In some embodiments, the light source 600 is a thin film transistor (TFT) electrically connected to the TFT backplane 606 through the line redistribution layer RDL-2 and the line redistribution layer RDL-1. In some embodiments, the thin film transistor (TFT) in the TFT backplane 606 includes a gate M1 and a semiconductor layer SEMI. In some embodiments, the semiconductor layer SEMI may include, for example, low temperature polysilicon (LTPS), amorphous silicon, or metal oxide, but the present disclosure is not limited thereto. The semiconductor layer SEMI is used to form the channel of the transistor. The gate M1 is disposed on the interlayer dielectric layer (ILD1:SiOx). The interlayer dielectric layer (ILD1:SiOx) may for example include silicon oxide. The interlayer dielectric layer (ILD2:SiNx) may for example include silicon oxide. The semiconductor layer SEMI is disposed on the insulating layer (GI:SiOx). The insulating layer (GI:SiOx) may for example include silicon oxide. In some embodiments, the optical sensor 602 includes a PIN-type junction and a bottom electrode 608. The PIN-type junction is disposed between the planarization layer (PLN1) and the planarization layer (PLN2). The bottom electrode 608 is disposed on the planarization layer (PLN1). In some embodiments of FIG. 6, the optical sensor 602 is fabricated through a thin film process, but the present disclosure is not limited thereto. In some embodiments, a light-blocking layer (PDL) is disposed around the light source 600 and the color filter layer 604 for shielding light scattered from the finger (such as the finger 510 in FIG. 5). The reflected portion of the light reflected from the finger passes through the color filter layer 604 and is finally received by the optical sensor 602.

Figure 7A:
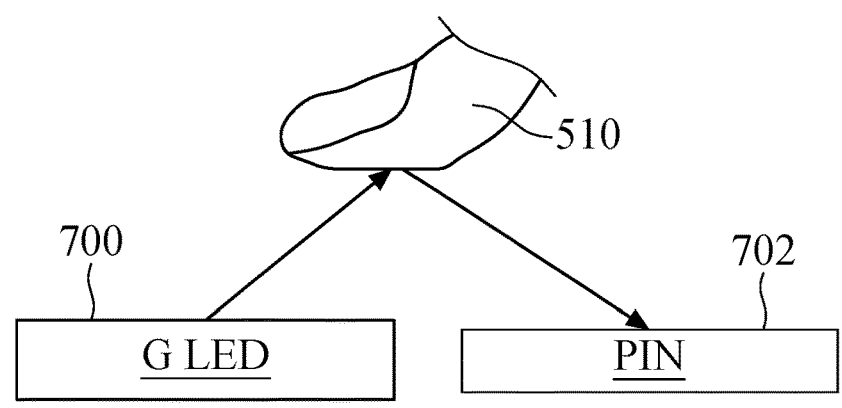
FIG. 7A is a structural schematic diagram of an electronic device in accordance with some embodiments of the present disclosure.

FIG. 7A is a structural schematic diagram of an electronic device in accordance with some embodiments of the present disclosure. As shown in FIG. 7A, the electronic device of the present disclosure may include a light source 700 and an optical sensor 702. The optical sensor 702 includes a PIN-type junction (PIN). In some embodiments of FIG. 7A, the light source 700 is a green light-emitting element (G LED). The light source 700 emits green light, the green light is reflected by the finger 510, and the reflected portion of the green light is received by the light source sensor 702. The configuration of the electronic device in FIG. 7A can achieve the technical effect of improving the response value of the light source sensor 702.

Figure 7B:
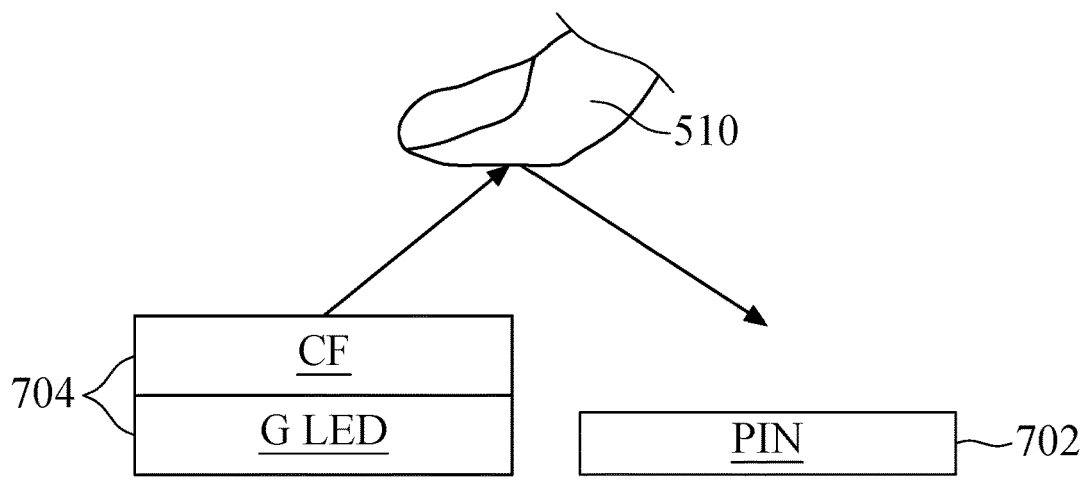
FIG. 7B is a structural schematic diagram of an electronic device in accordance with some embodiments of the present disclosure.

FIG. 7B is a structural schematic diagram of an electronic device in accordance with some embodiments of the present disclosure. As shown in FIG. 7B, the electronic device of the present disclosure may include a light source 704 and an optical sensor 702. In some embodiments of FIG. 7B, the light source 704 includes a green light-emitting element G LED and a color filter layer CF. The color filter layer CF is disposed on the green light-emitting element G LED. The green light-emitting element G LED emits green light. The green light is filtered by the color filter layer CF and reflected by the finger 510. The reflected portion of the green light is received by the light source sensor 702. The configuration of the electronic device in FIG. 7B can achieve the technical effect of improving the response value of the light source sensor 702.

Figure 7C:
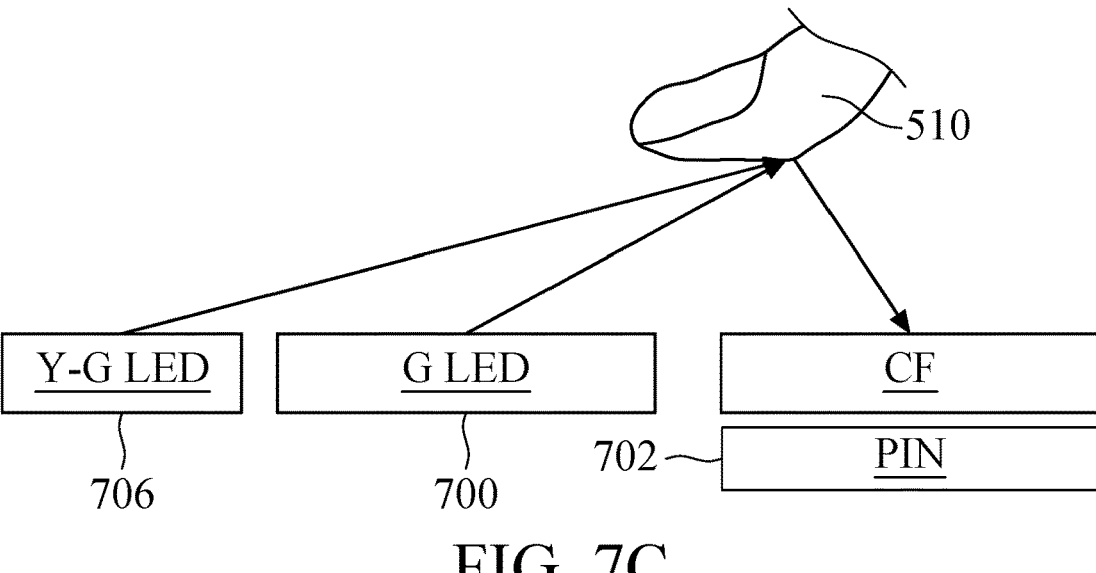
FIG. 7C is a structural schematic diagram of an electronic device in accordance with some embodiments of the present disclosure.

FIG. 7C is a structural schematic diagram of an electronic device in accordance with some embodiments of the present disclosure. As shown in FIG. 7C, the electronic device of the present disclosure may include a light source 700, an optical sensor 702, a color filter layer CF, and a light source 706. In some embodiments, the light source 700 is a green light-emitting element (G LED). The light source 706 is a yellow-green light-emitting element (Y-G LED). In some embodiments, the light intensity of the light source 700 is higher than that of the light source 706, but the present disclosure is not limited thereto. The color filter layer CF is disposed on the optical sensor 702. The light source 700 emits green light, the light source 706 emits yellow-green light, and the green light and the yellow-green light are mixed to form a mixed light. The mixed light is reflected by the finger 510, and the reflected portion of the mixed light is filtered by the color filter layer CF and finally received by the optical sensor 702. The configuration of the electronic device in FIG. 7C can achieve the technical effect of improving the response value of the light source sensor 702.

Figures 8A, 8B:
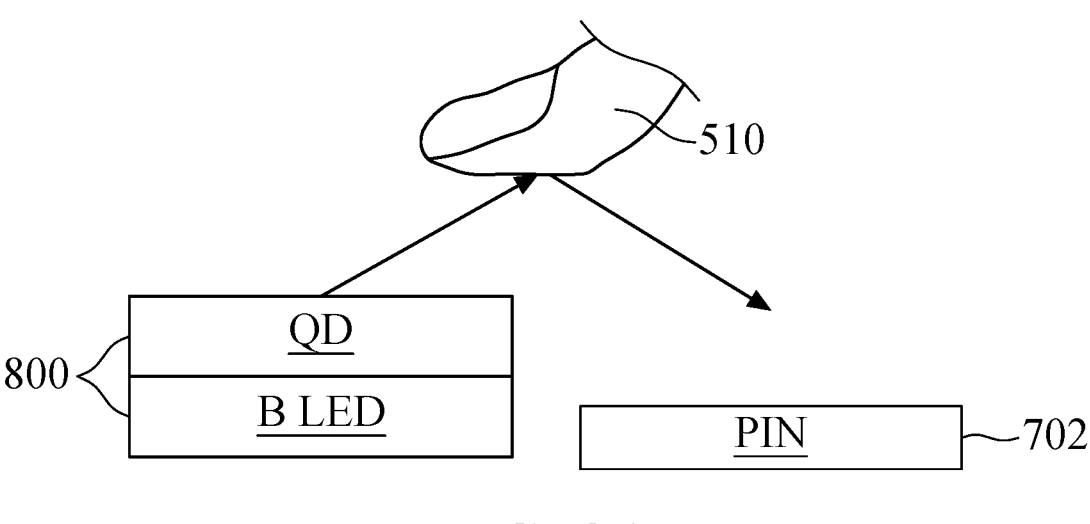
FIG. 8A is a structural schematic diagram of an electronic device in accordance with some embodiments of the present disclosure.
FIG. 8B is a structural schematic diagram of an electronic device in accordance with some embodiments of the present disclosure.

FIG. 8A is a structural schematic diagram of an electronic device in accordance with some embodiments of the present disclosure. As shown in FIG. 8A, the electronic device of the present disclosure includes a light source 800 and an optical sensor 702. In some embodiments of FIG. 8A, the light source 800 includes a blue light-emitting element B LED and a wavelength conversion layer QD. The wavelength conversion layer QD is disposed on the blue light-emitting element B LED to convert the blue light emitted by the blue light-emitting element B LED to generate an adjusted light. The wavelength conversion layer QD can be, for example, quantum dots, but the present disclosure is not limited thereto. The adjusted light is reflected by the finger 510, and the reflected portion of the adjusted light is received by the optical sensor 702. The configuration of the electronic device in FIG. 8A can achieve the technical effect of improving the response value of the light source sensor 702.

FIG. 8B is a structural schematic diagram of an electronic device in accordance with some embodiments of the present disclosure. As shown in FIG. 8B, the electronic device of the present disclosure includes a light source 802, a color filter layer CF2, and an optical sensor 702. In some embodiments of FIG. 8B, the light source 802 includes a blue light-emitting element B LED, a wavelength conversion layer QD, and a color filter layer CF1. The wavelength conversion layer QD is disposed on the blue light-emitting element B LED for converting the blue light emitted by the blue light-emitting element B LED to generate an adjusted light. The adjusted light is filtered by the color filter layer CF1, reflected by the finger 510, filtered by the color filter layer CF2, and finally received by the optical sensor 702. The configuration of the electronic device in FIG. 8B can also achieve the technical effect of improving the response value of the light source sensor 702.

Figure 9:
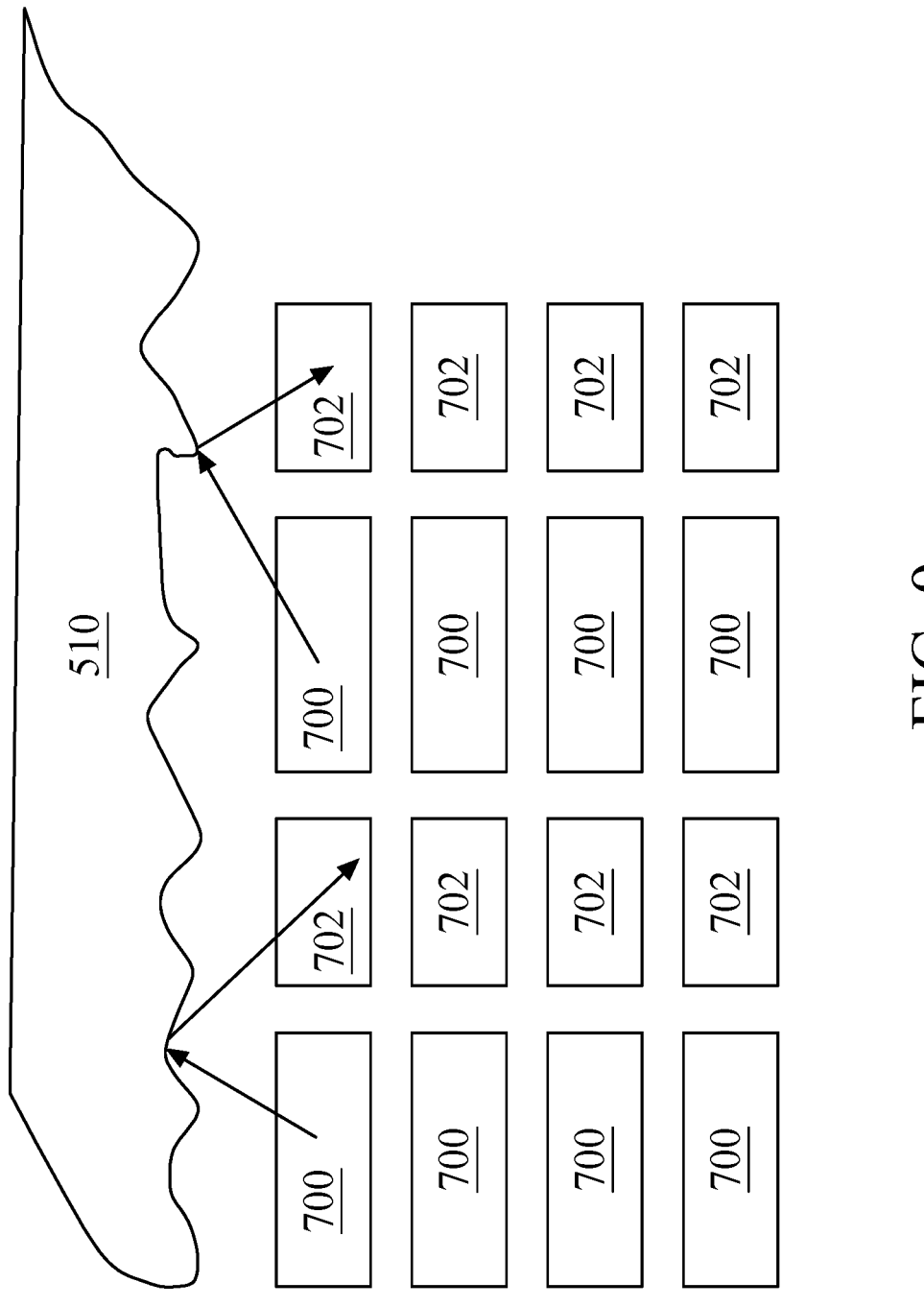
FIG. 9 is a schematic diagram of a biometric sensor device in accordance with some embodiments of the present disclosure.

FIG. 9 is a schematic diagram of a biometric sensor device in accordance with some embodiments of the present disclosure. As shown in FIG. 9, the electronic device of the present disclosure is a biometric sensor device. The biometric sensor device includes a plurality of light sources 700 arranged in a row, and a plurality of light sensors 702 arranged in a row. The light sources 700 arranged in a row form a light source array. The light sensors 702 arranged in a row form a sensor array. In some embodiments of FIG. 9, the light source array and the sensor array are arranged alternately, but the present disclosure is not limited thereto. The light source array emits light, the light is reflected by the finger 510, and the reflected portion of the light is received by the sensor array. In some embodiments, the biometric sensor device may be, for example, a fingerprint recognition sensor. In other words, the sensor array is used to identify the fingerprint peaks and fingerprint valleys in the fingerprint according to the light intensity of the reflected portion of the detected light. Afterwards, the present disclosure matches the fingerprints generated by the sensor array with the biological information in a database, and finally achieves the purpose of biological identification.

Figure 10:
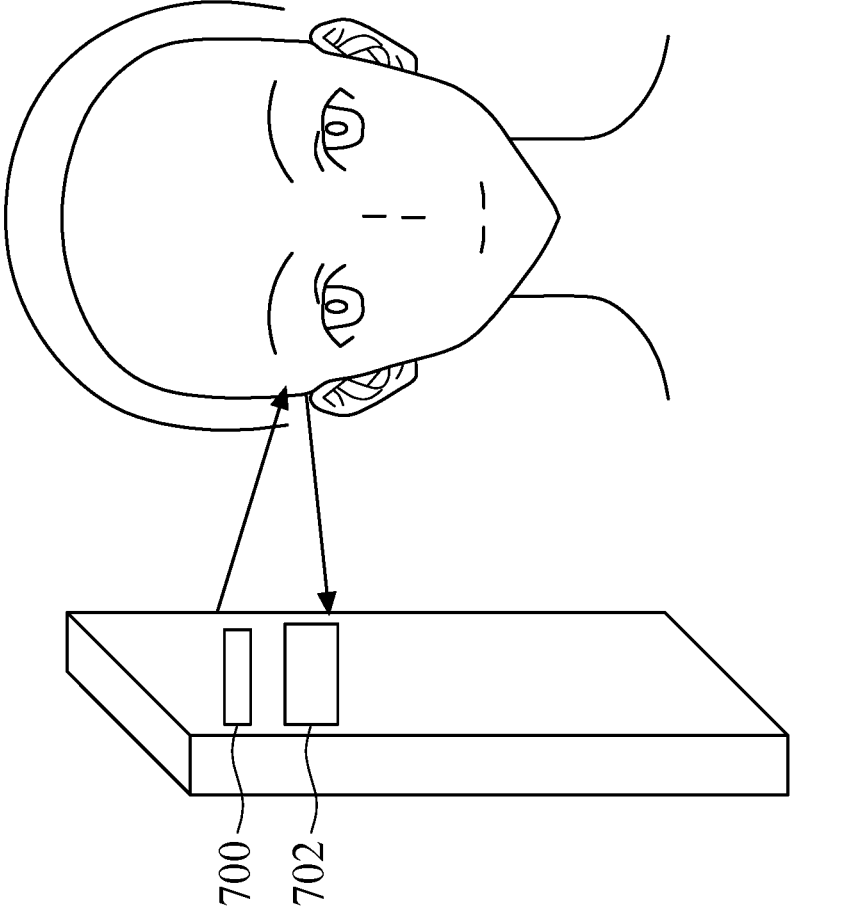
FIG. 10 is a schematic diagram of a proximity sensor device in accordance with some embodiments of the present disclosure.

FIG. 10 is a schematic diagram of a proximity sensor device in accordance with some embodiments of the present disclosure. As shown in FIG. 10, the electronic device of the present disclosure is a proximity sensor device. In some embodiments, the proximity sensor device is used to detect whether an object is approaching. The proximity sensor device includes a light source 700 and an optical sensor 702. The light source 700 is used to emit light. When the object (such as a human face) approaches the proximity sensor device, the light is reflected by the object, and the reflected portion of the light is received by the optical sensor 702. In some embodiments, the proximity sensor device can be installed in a smart phone. When the user picks up the phone to look at the screen of the phone, the optical sensor 702 of the proximity sensor device detects the reflected portion of the light. Therefore, the controller in the phone can send an enable signal to the screen, causing the screen to turn on. In some embodiments, the optical sensor 702 includes a silicon semiconductor, but the present disclosure is not limited thereto.

In response to the different response values of the optical sensor to different light wavelengths, the present disclosure designs the light emission spectrum of the light source to be positively correlated with the response value of the optical sensor, so as to improve the sensing sensitivity of the electronic device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a redistribution layer, comprising a first portion, a second portion, and a third portion;
a light source, disposed on the redistribution layer and electrically connected to the first portion and the second portion, configured to emit a light having a maximum light intensity at a first wavelength A; and
an optical sensor, disposed on the redistribution layer and electrically connected to the third portion, having a maximum response value at a second wavelength B, configured to receive a reflected portion of the light that is reflected by an object;
wherein the second wavelength B is longer than the first wavelength A,
wherein an integral value of a first light intensity of the light from the wavelength 380 nm to the first wavelength A is $I_1$, and an integral value of a second light intensity of the light from the first wavelength A to the wavelength 780 nm is $I_2$, and the first wavelength A, the second wavelength B, the first integral value $I_1$, and the second integral value $I_2$ satisfy the following equation:

$$(B - A) * (I_2 - I_1) > 0.$$

2. The electronic device as claimed in claim 1, wherein the first integral value $I_1$ and the second integral value $I_2$ satisfy the following equation:

$$1 < I_2/I_1 = 3.5.$$

3. The electronic device as claimed in claim 1, wherein the light source comprises a green light-emitting element.

4. The electronic device as claimed in claim 3, wherein the light source further comprises a color filter layer disposed on the green light-emitting element.

5. The electronic device as claimed in claim 1, wherein the light source further comprises another light-emitting element.

6. The electronic device as claimed in claim 5, wherein the green light-emitting element emits the light, and the another light-emitting element emits another light having a maximum light intensity at a wavelength longer than the first wavelength.

7. The electronic device as claimed in claim 6, wherein the light and the another light are mixed to form a mixed light and a reflected portion of the mixed light is received by the optical sensor.

8. The electronic device as claimed in claim 1, further comprising a color filter layer disposed on the optical sensor.

9. The electronic device as claimed in claim 1, wherein the first wavelength A ranges from 500 nm to 540 nm.

10. The electronic device as claimed in claim 1, wherein the first integral value $I_1$ of the light intensity of the light from the wavelength 380 nm to the first wavelength A is equal to energy in a left half of a spectral response curve of the light source.

11. The electronic device as claimed in claim 10, wherein the second integral value $I_2$ of the light intensity of the light from the first wavelength A to the wavelength 780 nm is equal to the energy in a right half of the spectral response curve of the light source.

12. An electronic device, comprising:

a redistribution layer, comprising a first portion, a second portion, and a third portion;

a light source, disposed on the redistribution layer and electrically connected to the first portion and the second portion, configured to emit a light having a maximum light intensity at a first wavelength A; and an optical sensor, disposed on the redistribution layer and electrically connected to the third portion, having a maximum response value at a second wavelength B, configured to receive a reflected portion of the light that is reflected by an object;

wherein the second wavelength B is longer than the first wavelength A, wherein the light has a light intensity of 50% of the maximum light intensity at a third wavelength C and a fourth wavelength D, and the third wavelength C is longer than the fourth wavelength D;

wherein the first wavelength A, the third wavelength C, and the fourth wavelength D satisfy the following equation:

$$C - A > A - D.$$

13. The electronic device as claimed in claim 12, wherein a difference between the third wavelength C and the first wavelength A and a difference between the first wavelength A and the fourth wavelength D are compared to determine whether the energy of a right half of a spectral response curve of the light source is higher than the energy of a left half of the spectral response curve of the light source.

14. The electronic device as claimed in claim 12, wherein the light has a light intensity of 25% of the maximum light intensity at a fifth wavelength E and a sixth wavelength F, and the fifth wavelength E is longer than the sixth wavelength F;

wherein a third integral value of the light intensity of the light from the wavelength E to the wavelength 780 nm is $I_3$, a fourth integral value of the light intensity of the light from the wavelength 380 nm to the sixth wavelength F is $I_4$, and the third integral value $I_3$ and the fourth integral value $I_4$ satisfy the following equation:

$$I_3 > I_4.$$

15. The electronic device as claimed in claim 12, wherein the optical sensor comprises a silicon semiconductor.

16. The electronic device as claimed in claim 12, wherein the optical sensor comprises an organic photodiode.

17. The electronic device as claimed in claim 12, wherein the electronic device is a biometric sensor device or a proximity sensor device.

* * * * *